March 5, 1963

K. A. EDWARDS 3,080,533

PHASE-LOCK OSCILLATOR

Filed Jan. 29, 1959

2 Sheets-Sheet 1

INVENTOR:
KEITH A. EDWARDS,
BY T. E. Kristofferson
HIS ATTORNEY.

INVENTOR:
KEITH A. EDWARDS,
BY T. E. Kristofferson
HIS ATTORNEY.

United States Patent Office 3,080,533
Patented Mar. 5, 1963

3,080,533

PHASE-LOCK OSCILLATOR

Keith A. Edwards, Manlius, N.Y., assignor to General Electric Company, a corporation of New York Filed Jan. 29, 1959, Ser. No. 789,835
9 Claims. (Cl. 331—8)

This invention relates to a phase locked oscillator loop, and more particularly to improvements therein employing a transistorized phase detector and phase lock indicator.

Phase locked oscillator control loops have been used extensively in television horizontal sweep circuits and color television applications. The usual indication of unlock is loss of horizontal sweep. Phase detectors are generally well known in the art. Series connected transistors have been used in the past as coincidence gates in pulse circuit applications. This has been done to measure presence or absence of a pulse and not to obtain phase information. For safe application it is desirable to transistorize the circuits and provide a phase locked oscillator loop having an indicator for indicating the state of the loop.

Accordingly, it is an object of this invention to provide an improved phase locked oscillator loop.

Another object of this invention is to provide a transistorized phase detector for such a phase locked oscillator loop.

Still another object of this invention is to provide an improved phase lock indicator for such a phase locked oscillator loop.

A further object of this invention is to provide a phase locked oscillator loop employing an improved transistorized phase detector and a phase lock indicator capable of indicating when the oscillator is in the locked range, when it is unlocked, and when the signal has been lost.

In carrying out the invention in one form thereof a phase locked oscillator loop is provided, including a phase detector, a direct current amplifier, a filter network and a phase locked oscillator, all connected in series. The inputs to the phase detector are connected to the output of the phase locked oscillator and to a source of signals of a reference frequency. A phase lock indicator is connected to the output of the phase detector. The phase detector itself is a transistorized coincidence gate which has an output of one order of magnitude when the gate is open or when the signals are both of one polarity, and of another order of magnitude when the gate is closed, or when either or both of the signals are of the other polarity. An integrator is then connected at the output of this coincidence gate for obtaining a voltage of a magnitude proportional to the phase difference of the signals.

In another aspect of the invention the output of the phase detector is connected to the input of the phase lock indicator in such a manner that the normally conducting side of a Schmitt trigger circuit contained in the indicator conducts as long as the phase detector indicates that the phase locked oscillator is in the locked range. When the signal is lost, the normally non-conducting device of the Schmitt trigger circuit is caused to conduct. For the unlocked condition a switching transistor causes both devices of the Schmitt trigger circuit to become non-conducting. Indicator circuits in the collector circuits of the two active devices of the Schmitt trigger can then indicate the three states of the phase locked oscillator loop.

The novel features characteristic of the invention are set forth with particularity in the appended claims. The invention itself, however, together with further objects and advantages thereof, can best be understood by reference to the following description taken in connection with the accompanying drawings in which:

Figure 1:
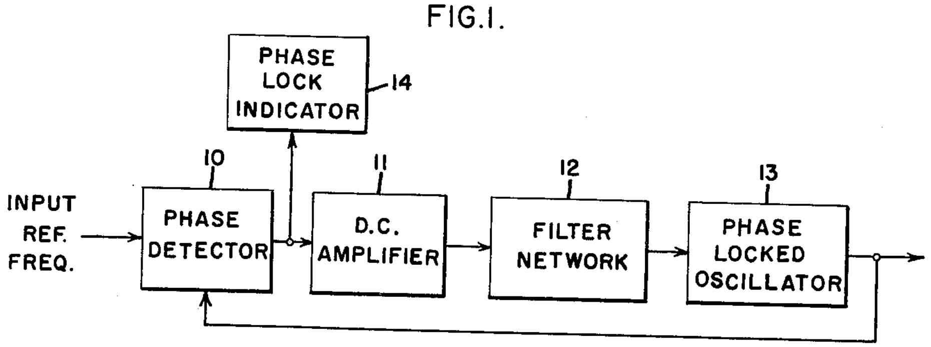
FIG. 1 is a block diagram of the phase locked oscillator loop of the invention.

Turning now to the drawings in FIG. 1 there is illustrated a phase locked oscillator loop comprising a phase detector 10 having an output connected through a D.-C. amplifier 11 and a filter network 12 to the input of a phase locked oscillator 13. The output of the phase locked oscillator 13 is, in turn, connected back to one input of phase detector 10 which has a reference frequency connected to another of its inputs. These two input frequencies are compared in the phase detector and any difference above a certain acceptable level is amplified in D.-C. amplifier 11 and sent through filter network 12 to control phase locked oscillator 13. In addition, a phase lock indicator 14, as here shown, is connected to the output of phase detector 10. The purpose of this phase lock indicator is to give an indication of when the frequency of phase locked oscillator 13 is in synchronism with the input reference frequency. When this condition of synchronism exists, the phase difference is never greater than 180°. It may also indicate whether the signal has been lost or whether the oscillator is unlocked. Thus, phase lock indicator 14 may be used to indicate three possible states of the phase locked oscillator loop. This will be better understood upon reference to the operation of the phase lock indicator 14 which is described more fully in connection with the schematic diagram of FIG. 6.

Figure 2:
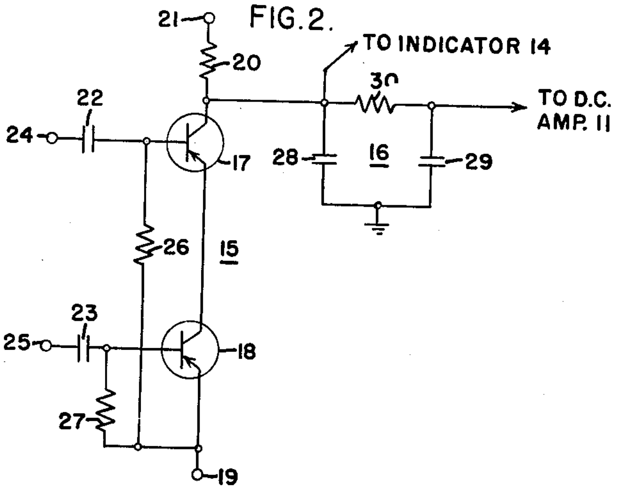
FIG. 2 is a schematic diagram of the phase detector employed in the block diagram of FIG. 1.

FIG. 2 shows one embodiment of the phase detector 10 of FIG. 1 in schematic. This phase detector circuit of FIG. 2 may be broken down into a transistorized coincidence circuit 15 and an integrator circuit 16. The transistorized coincidence gate 15 employs two transistors 17 and 18, each having at least a base, a collector and an emitter electrode. The transistors here shown are of the PNP type; however, it is obvious to those skilled in the art that NPN transistors may be used as well by merely reversing the polarities involved. A source of positive potential is connected to terminal 19 which is connected in a turn to the emitter of transistor 18. The collector of transistor 18 is then connected to the emitter of transistor 17, while the collector of transistor 17 is connected through an impedance 20 to a terminal 21 which is adapted for connection to a source of potential relatively negative to that connected to terminal 19. The bases of transistors 17 and 18 are connected respectively through capacitors 22 and 23 to terminals 24 and 25. The bases of transistors 17 and 18 are also connected respectively through impedances 26 and 27 to terminal 19. Terminals 24 and 25 are adapted for connection to the reference frequency input and to the output of phase locked oscillator 13, as illustrated in FIG. 1. Integrator circuit 16 is connected to the collector of transistor 17, and is here shown to comprise two capacitors 28 and 29 and a resistor 30. This integrator may, however, be any well known form of integrator. Capacitor 28 is shown connected between collectors 17 and ground, and in parallel with resistors 30 and 29. The integrated output naturally appears across capacitor 28.

Figure 3:
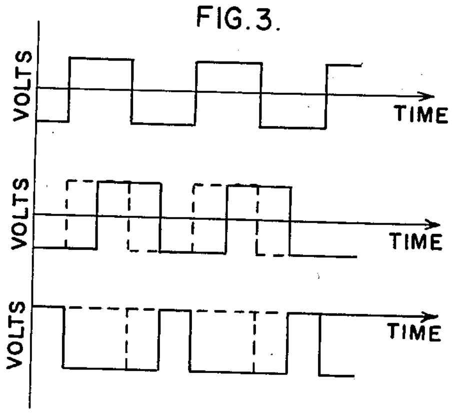
FIG. 3 is a graph of the input and output of the transistorized coincidence circuit in the first part of FIG. 2.
Figure 4:
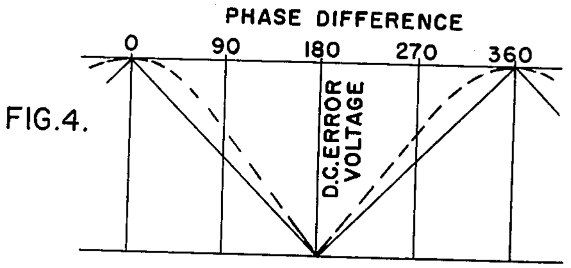
FIG. 4 is a graph of the output of the phase detector of FIG. 2.

The operation of the phase detector of FIG. 2 can best be described in conjunction with the graphs of FIGS. 3 and 4. Transistors 17 and 18 saturate if, and only if, both bases are simultaneously negative with respect to terminal 19. If capacitor 28 is disconnected so that the waveform at the output of coincidence gate 15 may be examined, FIG. 3 will aid in understanding the operation. Square wave inputs have been illustrated; however, other waveforms such as sine waves will work as well. The solid line graphs on the first and second time axes illustrate inputs to terminals 24 and 25 of FIG. 2, having a 90° phase difference, and the dotted lines show the change in width of the output pulse with no phase difference. The graph on the third time axis illustrates the output from the two transistor coincidence gate 15. It can be seen by referring to the solid lines that only when both square waves shown in the top true drawings of FIG. 3 are both negative is there an output pulse as shown in the bottom line of FIG. 3. This is given as the condition when both transistors 17 and 18 are conducting. It can be seen by extrapolating that a 180° phase difference would reduce the output pulse width to zero, and that the pulse widths at the output for 270° and 360° would correspond respectively to 90° and 0° phase difference.

The addition of capacitor 28 produces a direct voltage output proportional to the area of the pulses as illustrated in FIG. 4. Thus, an output voltage is obtained directly proportional to the phase difference between the inputs. FIG. 4 illustrates this output voltage vs. phase difference. The solid line is an idealized curve while the dashed line shows the curve of a practical circuit in which the upper peaks are rounded and the slope changes depending upon the value of impedance 20. This dashed line effect, or the rounding of the upper peaks, is the effect of increasing impedance 20.

Figure 6:
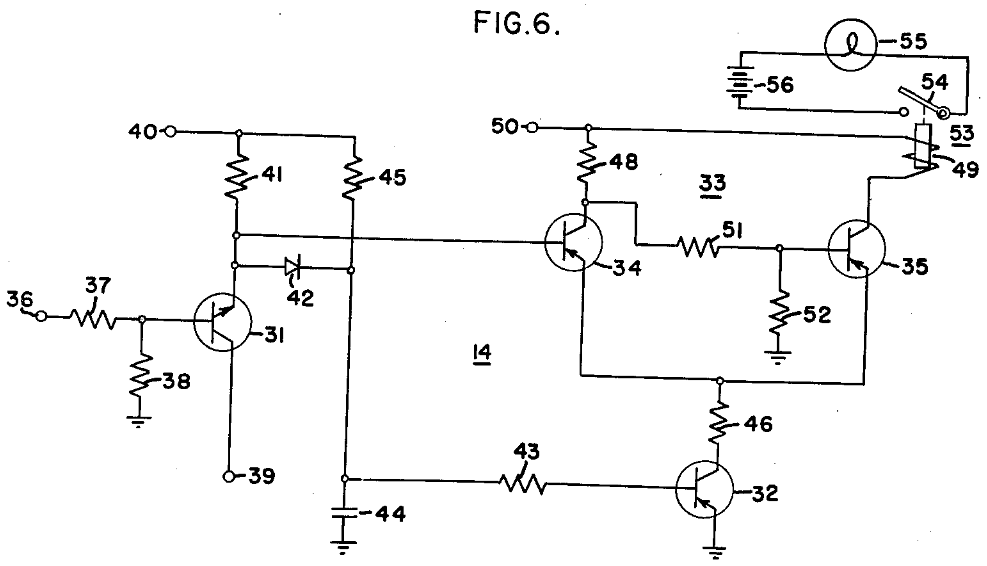
FIG. 6 is a schematic diagram of one form of phase lock indicator for use in the circuit of FIG. 1.

In order to get an indication of the state of the phase locked oscillator loop illustrated in FIG. 1 we employ the phase lock indicator 14. One embodiment of such an indicator is illustrated in FIG. 6. The indicator of FIG. 6 employs an emitter follower switching transistor 31, a switching transistor 32 and a Schmitt trigger circuit 33 employing two active transistor devices 34 and 35. Each of these transistors has at least an emitter, a collector and a base electrode. The input to indicator 14 connected to terminal 36 is derived from the output of the integrator of the phase detector of FIG. 2. It is here shown as connected by means of impedances 37 and 38 to the base of emitter follower switching transistor 31. The collector of transistor 31 is connected to a terminal 39 which is adapted for connection to a source of potential positive with respect to a second source of potential. This second source of potential is connected to terminal 40 and, in turn, through an impedance 41 to the emitter of transistor 31. One output from the emitter of emitter follower transistor 31 is connected to the base of transistor 34 in Schmitt trigger circuit 33.

Another output from the emitter of transistor 31 is connected through a semiconductor diode 42 and through a series impedance 43 to the base of switching transistor 32. The emitter of switching transistor 32 is connected to ground. A capacitor 44 is connected from between diode 42 and impedance 43 to ground. An additional impedance 45 is connected from between terminal 40 and the side of capacitor 44 above ground. The emitters of transistors 34 and 35 are connected through the emitter-collector circuit of switching transistor 32 and the impedance 46 to ground. The collectors of transistors 34 and 35 are then connected, in turn, through impedances 48 and 49 to terminal 50 which is adapted for connection to a negative source of potential. Here again, transistor types and polarities may be reversed. A crossover network comprising resistors 51 and 52 is connected from the collector of transistor 34 to the base of transistor 35. This is done by connecting resistor 51 directly between these points and resistor 52 from the base of transistor 35 to ground.

Impedance 49 is illustrated as constituting a coil of the relay 53 having a contact arm 54 for actuating an indicating light 55 by means of battery 56 when contact arm 54 is in the closed condition. This arm 54 is in the closed condition when there is current conducting through coil 49 or when transistor 35 is conducting.

When the AFC system becomes unlocked, the input frequencies to the phase detector of FIG. 2 are different and the input voltage at terminal 36 of FIG. 6 is approximately two volts. This voltage is given for the configuration having the magnitude of resistors, etc. listed later in the specification. It is naturally understood that these are only indicative of one operable embodiment and that the invention described herein is not limited thereto. This input is also illustrated as $V_d$ in the diagram of FIG. 5. When the input is about two volts, which is labelled "unlocked" in the diagram of FIG. 5, transistor 31 conducts heavily. Its emitter goes positive and it draws current through diode 42 to cutoff transistor 32. The current in relay 53 through coil 49 then has no path to ground so that relay is open indicating unlocked condition.

When the AFC system is phase locked, the voltage at terminal 36 becomes somewhat negative, decreasing the conduction of transistor 31, thus causing its emitter voltage to become somewhat negative. As this voltage approaches a negative value the base of transistor 32 becomes negative and it conducts. The current then flows through the relay coil 49, closing contact 54, and indicating a locked condition. Transistor 34 is still cutoff due to its negative emitter.

Figure 5:
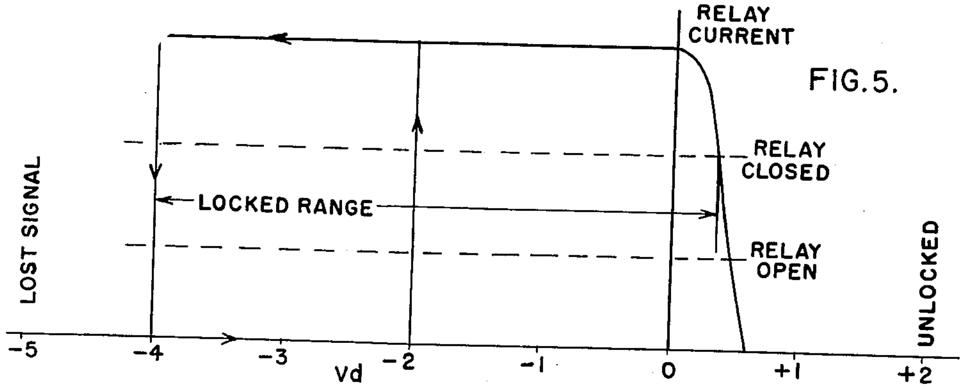
FIG. 5 is a graph of the relay current for the indicating relay illustrated in FIG. 6 for various levels of output of the phase detector of FIG. 2.

When one input signal to the phase detector illustrated in FIG. 2 is lost, the input signal at terminal 36 becomes about −5 volts and is indicated as a lost signal in the diagram of FIG. 5. Transistor 31 then becomes cutoff and the negative voltage on its emitter is sufficient to trip Schmitt trigger circuit 33 by applying a negative voltage to the base to transistor 34 causing it to conduct. The crossover network comprising resistors 51 and 52 then cuts off conduction in transistor 35, thus opening contact 54 on relay 53 to indicate the unlocked condition. Diode 42 prevents the base current of transistor 32 from becoming excessive as the emitter of transistor 31 rises to a high enough negative potential to cause the Schmitt trigger to change states. The base current of transistor 32 is then limited by resistors 43 and 45. As illustrated in FIG. 5 there is about a two volt hysteresis effect in the left hand edge of the characteristic. The hysteresis does not interfere with proper operation of the phase lock indicator because of the manner in which the loop approaches the phase locked or synchronized condition from a lost signal condition. Before synchronization can take place, a signal must appear; the voltage $V_d$ then changes almost instantaneously from approximately −5 to +2 volts. A false indication during this transistion is prevented by the time delay of the relay 53, this time delay may be extended by the addition of a capacitor across the coil 49 or other standard techniques. The locked condition then is always approached from a $V_d$ of positive polarity. The locked range may therefore safely include the hysteresis zone. If this indicator were used with some other device which could approach a locked range from a negative $V_d$, the locked range could not include the hysteresis zone. However, adjustment of component values in the Schmitt trigger circuit 33 would permit a considerable reduction of the hysteresis as is well known. Capacitor 44 was inserted to remove a false lock indication while sweeping the oscillator freqency due to the heterodyne output of the phase detector.

Turning back to the Schmitt trigger circuit of FIG. 6, it can be seen that a combination of indicators may be employed to give an indication of unlocked vs. lost signal. This may be done by placing an indicator in the collector circuit of transistor 34. The combination of the two indicators will then provide the necessary information to tell you which of the three states the phase locked oscillator loop is in, namely, unlocked, lost signal, or locked range.

Component magnitudes for one embodiment of the invention for the circuits of FIG. 2 and of FIG. 6 are as follows:

| | |
|---|---|
| Transistors 17 and 18 | 2N123's. |
| Resistor 20 | 2.2K. |
| Capacitors 22 and 23 | 1 microfarad. |
| Resistors 26 and 27 | 10K. |
| Capacitors 28 and 29 | .1 microfarad. |
| Resistor 30 | 2.2K. |
| Transistor 31 | 1N198. |
| Transistors 32, 34 and 35 | 2N123's. |
| Resistor 37 | 22K. |
| Resistor 38 | 33K. |
| Voltage at terminal 39 | 5 volts. |
| Voltage at terminal 40 | —5 volts. |
| Resistors 41 and 45 | 10K. |
| Resistor 43 | 3.3K. |
| Diode 42 | 1N198. |
| Capacitor 44 | 5 microfarads. |
| Resistor 48 | 2.2K. |
| Resistor 51 | 3.3K. |
| Resistor 52 | 1K. |
| Voltage at terminal 50 | —20 volts. |
| Relay 53 | Sigma 22—RJCC—1000J–SIL D.P.D.T. 1000 ohm relay. |

While the principles of the invention have now been made clear, there will be immediately obvious to those skilled in the art many modifications in structure, arrangement, proportions, the elements and components used in the practice of the invention, and otherwise, which are particularly adapted for specific environments and operating requirements without departing from those principles. The appended claims are therefore intended to cover and embrace any such modifications within the limits of the true spirit and scope of the invention.

What I claim and desire to secure by Letters Patent of the United States is:

1. An indicator circuit comprising, a transistorized emitter follower switch adaped for connection to an input signal for obtaining an output signal of at least a given magnitude, a Schmitt trigger circuit employing two transistors each having at least an emitter, a base and a collector electrode, a switching transistor having at least an emitter, a base and a collector electrode, means connecting the emitter collector path of said switching transistor in series with an impedance from the emitters of said two transistors to one source of potential, means including a semiconductor diode connected between the emitter of said emitter follower switch and the base of said switching transistor for biasing said switching transistor to its non-conducting state for an output from said emitter follower switch above said given magnitude, crossover means connecting the base electrode oft he normally conducting transistor to the collector electrode of the normally non-conducting transistor of said Schmitt trigger, means connecting the emitter of said emitter follower to the base of said normally non-conducting transistor for causing it to conduct when said emitter follower switch is cut off, and impedance means connected between each of the collectors of said two transistors and a second source of potential, said impedance means including at least one indicating means for indicating the state of at least one of said two transistors.

2. In a phase locked oscillator loop comprising, a phase detector, a direct current amplifier, a filter network and a phase locked oscillator all connected in series, said phase detector having at least two inputs one of which is connected to the output of said phase locked oscillator, a source of signals of a reference frequency, means connecting said source to another input of said phase detector and a phase lock indicator connected to the output of said phase detector, an improvement in said phase detector comprising a transistorized coincidence gate, said gate having an output of one order of magnitude only during the periods when portions of said signals occur simultaneously with one polarity and of another order of magnitude if either or both of said signals are of the other polarity, integrating means connected to the output of said gate for obtaining a voltage of a magnitude proportional to the phase difference of said signals, and means for applying said obtained voltage to said phase locked oscillator, said indicator comprises an emitter follower circuit responsive to said voltage of said integrating means for obtaining a first output signal for a first departure of said voltage in a first direction from a given level and for obtaining a second output signal for a second departure of said voltage in a second direction from said given level, a Schmitt trigger circuit having a first and second state of operation and normally existing in said first state of operation, said Schmitt trigger responsive to said first output signal for changing the operating state of said trigger circuit from said first state to said second state, a diode switching circuit coupled to the output of said emitter follower circuit and responsive to said second output signal for disabling said trigger circuit, and means responsive to the disablement of said trigger circuit and the operation of said trigger circuit in said second state for indicating a departure of said integrated signal from said given level.

3. An arrangement according to claim 2 wherein said last-named means for indicating comprises means responsive to the operation of said trigger circuit in said second state for providing an indicating signal and means responsive to the disablement of said trigger circuit for providing an indicating signal.

4. In combination, an indicator for signals available from a source comprising an emitter follower circuit responsive to signals from said source for obtaining a first output signal for a departure of said source signals in a first direction from a given level and for obtaining a second output signal for a second departure of said source signals in a second direction from said given level, a bistable trigger circuit having a first and second state of operation and normally existing in said first state of operation, diode switching means coupled to the output of said emitter follower circuit and responsive to said first output signal for changing the operating state of said trigger circuit from said first state to said second state, and disabling means responsive to said second output signal for disabling said trigger circuit.

5. In combination, a source of first pulses, a source of second pulses, means responsive to said first and second pulses for providing output pulses only during the periods when portions of said first and second pulses occur simultaneously with one polarity, said output pulses having a time duration proportional to the degree of time overlap in occurrence of said first and second pulses, means for integrating said output pulses to produce a control signal having a magnitude proportional to the magnitude of said output pulses, means responsive to said control signal for obtaining a first output signal for a first departure of said control signal in a first direction from a given magnitude and for obtaining a second output signal for a second departure of said control signal in a second direction from said given magnitude, a control circuit having a first and second state of operation and normally existing in said first state of operation, said control circuit responsive to said first output signal for changing its state of operation from said first state to said second state, disabling means responsive to said second output signal for disabling said trigger circuit from operating in either said first or second states of operation, and means responsive to said control circuit and said disabling means for indicating a departure of said integrated signal of said control circuit from said given magnitude.

6. In an indicator circuit, the elements comprising; first means adapted for connection to an input signal for obtaining a first output signal for one level of said input signal, a second output signal for a second level of said input signal, and a third output signal for a third level of said input signal; a Schmitt trigger circuit including two active devices, a first of which is normally conducting and the second of which is normally non-conducting; switching means connected between said first means and said Schmitt trigger circuit for controlling the flow of current in said normally conductive portion of said Schmitt trigger circuit, causing it to continue to conduct fully in response to said first output signal and inhibiting its conduction in response to said second output signal; and means coupling said first means to the normally non-conducting portion of said Schmitt trigger circuit to cause it to conduct in response to said third output.

7. In an indicator circuit, the elements comprising; first means adapted for connection to an input signal for obtaining a first output signal for one level of said input signal, a second output signal for a second level of said input signal, and a third output signal for a third level of said input signal; a trigger circuit including first and second active elements, the first of which is normally conducting and the second of which is normally non-conducting; switching means connected between said first means and said first active element for exercising control over the flow of current in said first active element, said switching means allowing current to flow in response to said first output signal, but inhibiting current flow in response to said second output signal; and means coupling said third output signal to the second or normally non-conducting element of said trigger circuit to cause it to conduct and to render said first active element non-conducting.

8. A phase locked oscillator loop comprising, a source of signals of a given frequency, a phase locked oscillator generating signals of said frequency and of a phase which may vary from that of said source, two transistors each having at least an emitter, a base and a collector electrode, a direct connection between one collector of one and one emitter of the other of said transistors, means coupling said source to one of said base electrodes, means coupling the output of said phase locked oscillator to the other of said base electrodes, a source of potential of one magnitude connected to the other emitter, a source of potential of another magnitude connected through an impedance to the other collector, separate impedances connected from each of said base electrodes to said other emitter, an integrator connected to said other collector for obtaining an integrated signal of a magnitude proportional to the phase difference of the signals applied to said base electrodes, means connected between said integrator and said phase locked oscillator for adjusting the phase of said oscillator, and an indicator circuit connected to the output of said integrator comprising, first means adapted for connection to an input signal for obtaining a first signal for a first departure of said input signal in a first direction from a given level of potential and for obtaining a second signal for a second departure of said input signal in a second direction from said given level of potential, a Schmitt trigger circuit having two active devices, said trigger circuit having a first and second state of operation and normally existing in said first state of operation, switching means connected to the output of said first means for switching said active devices off in response to said first signal, means connecting an input of one of said active devices to the output of said first means for changing the operation of said trigger circuit to its second state in response to said second signal, and means for indicating the state of operation of said trigger circuit.

9. A phase locked oscillator loop comprising, a source of signals of a given frequency, a phase locked oscillator generating signals of said frequency and of a phase which may vary from that of said source, two transistors each having at least an emitter, a base and a collector electrode, a direct connection between one collector of one and one emitter of the other of said transistors, means coupling said source to one of said base electrodes, means coupling the output of said phase locked oscillator to the other of said base electrodes, a source of potential of one magnitude connected to the other emitter, a source of potential of another magnitude connected through an impedance to the other collector, separate impedances connected from each of said base electrodes to said other emitter, an integrator connected to said other collector for obtaining an integrated signal of a magnitude proportional to the phase difference of the signals applied to said base electrodes, means connected between said integrator and said phase locked oscillator for adjusting the phase of said oscillator, and an indicator circuit connected to the output of said integrator comprising, a transistorized emitter follower switch adapted for connection to an input signal for obtaining a first signal for a first departure of said integrated signal in a first direction from a given level of potential and for obtaining the second signal for a second departure in a second direction from said given level of potential, a Schmitt trigger circuit employing two transistors each having at least an emitter, a base and a collector electrode, a switching transistor having at least an emitter, a base and a collector electrode, means connecting the emitter collector path of said switching transistor in series with an impedance from the emitters of said two transistors to one source of potential, means including a semiconductor diode connected between the emitter of said emitter follower switch and the base of said switching transistor for biasing said switching transistor to its non-conducting state in response to said first signal, crossover means connecting the base electrode of the normally conducting transistor to the collector electrode of the normally non-conducting transistor of said Schmitt trigger, means connecting the emitter of said emitter follower to the base of said normally non-conducting transistor for causing it to conduct in response to said second signal, and impedance means connected between each of the collectors of said two transistors and a second source of potential, said impedance means including at least one indicating means for indicating the state of at least one of said two transistors.

References Cited in the file of this patent

UNITED STATES PATENTS

| | | |
|---|---|---|
| 2,773,255 | Meier et al. | Dec. 4, 1956 |
| 2,774,872 | Howson | Dec. 18, 1956 |
| 2,802,899 | Sonnenfeldt | Aug. 13, 1957 |
| 2,820,143 | D'Nelly et al. | Jan. 14, 1958 |
| 2,831,126 | Linvill et al. | Apr. 15, 1958 |
| 2,868,975 | Harris et al. | Jan. 13, 1959 |
| 2,892,953 | McVey | June 30, 1959 |
| 2,908,868 | Jensen et al. | Oct. 13, 1959 |
| 2,945,135 | Wilhelmsen | July 12, 1960 |

OTHER REFERENCES

Time Bases, by Puckle, 2nd ed., 1955, pages 81–84, published by Wiley & Sons, Inc., New York.